(12) United States Patent
Vargas et al.

(10) Patent No.: US 7,329,466 B2
(45) Date of Patent: *Feb. 12, 2008

(54) ORGANIC ELEMENT FOR ELECTROLUMINESCENT DEVICES

(75) Inventors: J. Ramon Vargas, Webster, NY (US); Denis Y. Kondakov, Kendall, NY (US)

(73) Assignee: Eastman Kodak Company, Rochester, NY (US)

( * ) Notice: Subject to any disclaimer, the term of this patent is extended or adjusted under 35 U.S.C. 154(b) by 340 days.

This patent is subject to a terminal disclaimer.

(21) Appl. No.: 10/768,327

(22) Filed: Jan. 30, 2004

(65) Prior Publication Data

US 2005/0170204 A1 Aug. 4, 2005
US 2006/0210829 A9 Sep. 21, 2006

(51) Int. Cl.
*H01L 51/50* (2006.01)
*H01L 29/227* (2006.01)
*H01L 33/00* (2006.01)

(52) U.S. Cl. ............ 428/690; 428/917; 313/504; 313/506; 257/98

(58) Field of Classification Search .......... 428/690, 428/917; 313/504, 506; 546/13; 252/301.16
See application file for complete search history.

(56) References Cited

U.S. PATENT DOCUMENTS

| | | | |
|---|---|---|---|
| 5,683,823 A | 11/1997 | Shi et al. | |
| 6,661,023 B2 | 12/2003 | Hoag et al. | |
| 6,824,893 B2 * | 11/2004 | Hoag et al. | 428/690 |
| 6,885,026 B1 * | 4/2005 | Helber et al. | 257/40 |
| 7,074,503 B2 * | 7/2006 | Helber et al. | 428/690 |
| 7,147,938 B2 * | 12/2006 | Helber et al. | 428/690 |
| 2003/0198829 A1 | 10/2003 | Hoag et al. | |
| 2004/0058193 A1 | 3/2004 | Hatwar | |
| 2004/0076853 A1 | 4/2004 | Jarikov | |
| 2005/0208326 A1 * | 9/2005 | Helber et al. | 428/690 |
| 2005/0211958 A1 * | 9/2005 | Conley et al. | 252/583 |
| 2005/0221120 A1 * | 10/2005 | Owczarczyk et al. | 428/690 |
| 2006/0019116 A1 * | 1/2006 | Conley et al. | 428/690 |

FOREIGN PATENT DOCUMENTS

| | | |
|---|---|---|
| EP | 1 000 998 | 5/2000 |
| EP | 1 340 798 | 3/2003 |
| EP | 1 408 591 | 4/2004 |
| JP | 9-289081 | 11/1997 |
| JP | 11-97180 | 4/1999 |

OTHER PUBLICATIONS

Scheibe, Guenter et al., Zeitschrift fuer Physikalische Chemie (Muenchen, Germany), 64(1-4), 97-114 (German), 1969.*
Schellenberg et al., J. Chem. Physics, 95(1), Jul. 1, 1991, p. 189-194.*
STN database abstract for "Scheibe, Guenter et al., Zeitschrift fuer Physikalische Chemie (Muenchen, Germany), 64(1-4), 97-114 (German), 1969".*
M. J. Helber, et al., "Organic Element for Electroluminescent Devices", U.S. Appl. No. 10/768,776 (D-87483) filed Jan. 30, 2004.
M.J. Helber, et al., "Organic Element for Electroluminescent Devices", U.S. Appl. No. 10/768,289 (D-87138) filed Jan. 30, 2004.
M. J. Helber, et al., "Organic Element for Electroluminescent Devices", U.S. Appl. No. 10/769,492 (D-87137) filed Jan. 30, 2004.
D. Basting, et al., "New Laser Dyes", Applied Physics, 3, pp. 81-88, (1974).
R. Griebel, "The Influence of Viscosity on Fluorescence-Quantum-Yields of a Polymethine-Dye Dichinolyl-Cyano-Methane", Ber. Bunsenges, Phys. Chem., 84, (1980) pp. 84-91.

* cited by examiner

*Primary Examiner*—Dawn L. Garrett
(74) *Attorney, Agent, or Firm*—Arthur E. Kluegel

(57) ABSTRACT

Disclosed is an OLED device comprising a light-emitting layer containing a light emitting bis(azinyl)methene boron complex compound comprising a complex system of at least five fused rings and bearing, on at least one ring carbon or nitrogen, a substituent sufficient to provide a wavelength of maximum emission of less than 520 nm as measured at a concentration of $<10^{-3}$M in ethyl acetate solvent.

33 Claims, 1 Drawing Sheet

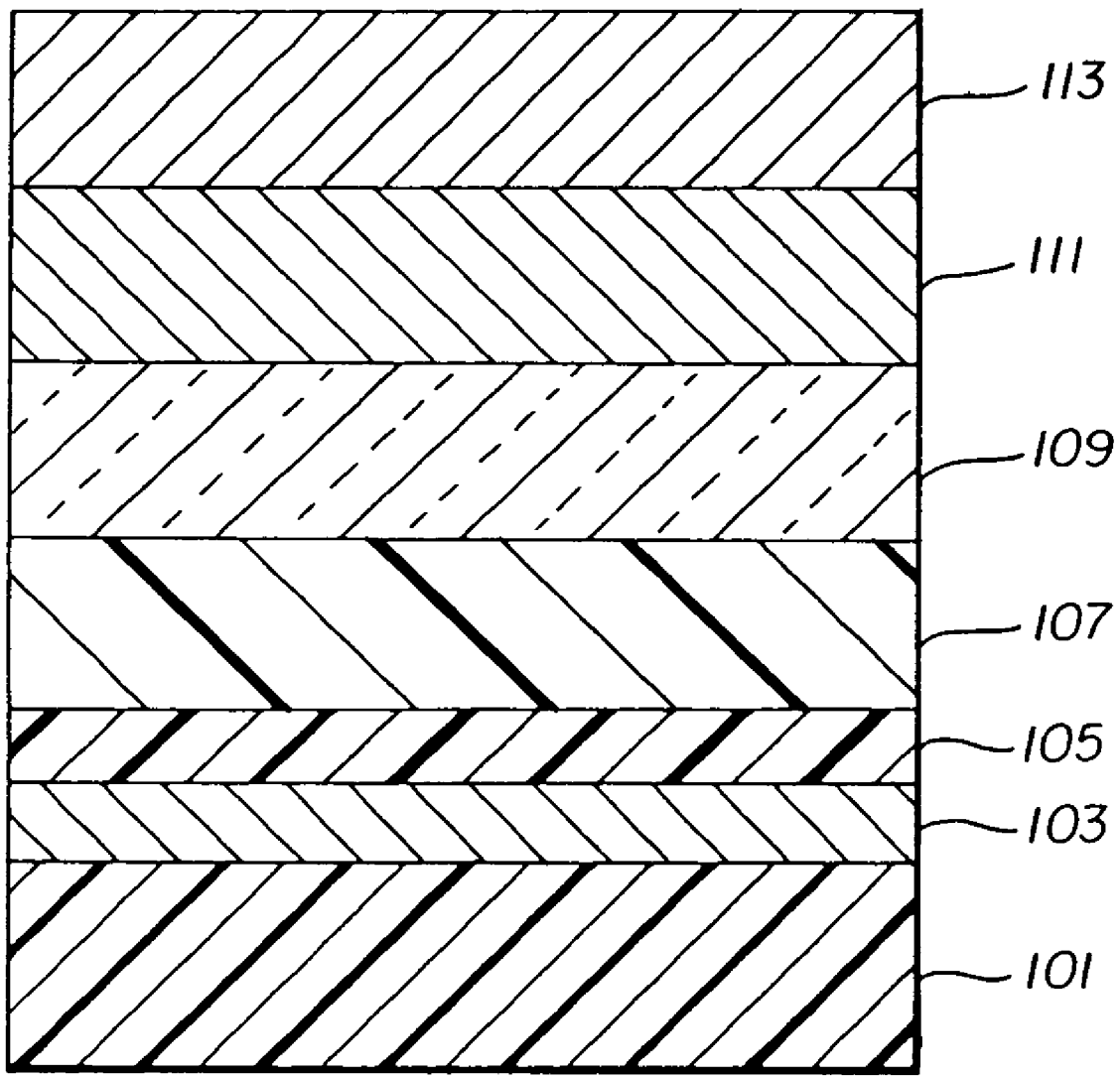

ORGANIC ELEMENT FOR ELECTROLUMINESCENT DEVICES

FIELD OF THE INVENTION

This invention relates to organic light emitting diode (OLED) electroluminescent (EL) device comprising a light-emitting layer containing a boron dopant compound containing a bis(azinyl)methene boron group.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322-334, 1969; and Dresner U.S. Pat. No. 3,710,167, issued Jan. 9, 1973. The organic layers in these devices, usually composed of a polycyclic aromatic hydrocarbon, were very thick (much greater than 1 µm). Consequently, operating voltages were very high, often >100V.

More recent organic EL devices include an organic EL element consisting of extremely thin layers (e.g. <1.0 µm) between the anode and the cathode. Herein, the organic EL element encompasses the layers between the anode and cathode electrodes. Reducing the thickness lowered the resistance of the organic layer and has enabled devices that operate at much lower voltage. In a basic two-layer EL device structure, described first in U.S. Pat. No. 4,356,429, one organic layer of the EL element adjacent to the anode is specifically chosen to transport holes, therefore, it is referred to as the hole-transporting layer, and the other organic layer is specifically chosen to transport electrons, referred to as the electron-transporting layer. The interface between the two layers provides an efficient site for the recombination of the injected hole/electron pair and the resultant electroluminescence.

There have also been proposed three-layer organic EL devices that contain an organic light-emitting layer (LEL) between the hole-transporting layer and electron-transporting layer, such as that disclosed by Tang et al [J. Applied Physics, Vol. 65, Pages 3610-3616, 1989]. The light-emitting layer commonly consists of a host material doped with a guest material or dopant, which results in an efficiency improvement and allows color tuning.

Since these early inventions, further improvements in device materials have resulted in improved performance in attributes such as color, stability, luminance efficiency and manufacturability, e.g., as disclosed in U.S. Pat. No. 5,061,569, U.S. Pat. No. 5,409,783, U.S. Pat. No. 5,554,450, U.S. Pat. No. 5,593,788, U.S. Pat. No. 5,683,823, U.S. Pat. No. 5,908,581, U.S. Pat. No. 5,928,802, U.S. Pat. No. 6,020,078, and U.S. Pat. No. 6,208,077, amongst others.

Notwithstanding these developments, there are continuing needs for organic EL device components, such as dopants, that will provide high luminance efficiencies combined with high color purity and long lifetimes.

A useful class of dopants is derived from the 5,6,5-tricyclic pyrromethene-BF2 complexes and disclosed in U.S. Pat. No. 5,683,823; JP 09 289,081A; JP 11 097,180A, and U.S. Patent Publication 2003-0198829-A1. These materials are characterized by typically narrow emission spectra, which may result in attractively high color purity. However, the green-emitting unsubstituted or alkyl substituted pyrromethene-BF2 complexes exhibit relatively low quantum efficiencies of electroluminescence. In order to achieve highly efficient OLEDs, one needs to use phenyl rings as substituents thereby extending the conjugated $\pi$-system. As a result, the emission wavelength typically becomes red-shifted yielding a reddish amber color, which is the shortest wavelength light that can be emitted by pyrromethene-BF2 complexes with good efficiency. In simple terms, luminance efficient green OLEDs do not appear to be conveniently obtained with pyrromethene $BF_2$ complexes used as dopants.

It is a problem to be solved to provide a light-emitting compound for a light-emitting layer of an OLED device that exhibits improved luminance efficiency and a desirable hue.

SUMMARY OF THE INVENTION

The invention provides an OLED device comprising a light-emitting layer containing a light emitting bis(azinyl) methene boron complex compound comprising a complex system of at least five fused rings and bearing, on at least one ring carbon or nitrogen, a substituent sufficient to provide a wavelength of maximum emission of less than 520 nm as measured at a concentration of $<10^{-3}M$ in ethyl acetate solvent. The invention also provides a lighting device containing the OLED, the complex compound, and a method of emitting the light employing the device.

The invention provides an OLED device that exhibits improved luminance efficiency and a desirable hue.

BRIEF DESCRIPTION OF THE DRAWINGS

The figure shows a cross-section of a typical OLED device in which this invention may be used.

DETAILED DESCRIPTION OF THE INVENTION

The invention is generally as described above.

An OLED device of the invention is a multilayer electroluminescent device comprising a cathode, an anode, charge-injecting layers (if necessary), charge-transporting layers, and a light-emitting layer (LEL) comprising a particular light emitting bis(azinyl)methene boron complex compound. The term azine or azinyl refers to a six-membered aromatic ring system containing at least one nitrogen (an azine ring system) as defined by the Hantzsch-Widman stems [The Naming and Indexing of Chemical Substances for Chemical Abstracts—A Reprint of Index IV (Chemical Substance Index Names) from the Chemical Abstracts—1992 Index Guide; American Chemical Society: Columbus, Ohio, 1992; paragraph 146].

A class of dopants for OLED devices that has been found useful includes 6,6,6-tricyclic bis(azinyl)methane boron complex group, and usefully a bis(pyridinyl)methane boron complex group. Such tricyclic compounds, however, can be inefficient in their quantum efficiency of emission. The quantum efficiency can be improved in derivatives in which additional unsaturated rings are fused to the tricyclic nucleus. Furthermore, the additional rings can improve the sublimation properties of the dopant, which can improve the manufacturability of resulting OLED devices. However, a deleterious side-effect of the added fused rings is the shifting of the emission to longer wavelengths, creating dopants with emissions that are less desirable.

Suitably, the light-emitting layer of the device comprises a host and dopant where the dopant is present in an amount of up to 10 wt % of the host, more typically from 0.1-5.0 wt % of the host. The group is suitably a bis(azinyl)methene boron complex compound comprising a ring system of at least five fused rings, and usefully a bis(pyridinyl)methene boron complex compound comprising a ring system of at least five fused rings, and desirably a bis(pyridinyl)methene boron complex compound or a bis(quinoyl)methane boron complex compound comprising a ring system of five or six fused rings. The fused rings desirably include unsaturation, and the unsaturated fused rings conveniently form an aromatic ring system. Good results are obtained when one or more additional ring substituent groups are present, in particular those that will be further described.

The benefit imparted by the dopant does not appear to be host specific. Desirable hosts include those based on a chelated oxinoid compound or an anthracene compound. Particular examples of hosts are tris(8-quinolinolato)aluminum (III) and 2-tert-butyl-9,10-di-(2-naphthyl). Desirably a combination of host of the oxinoid and the anthracene type are use as co-hosts in an amount of at least 50 wt % or even at least 75 wt % of the layer.

Embodiments of the dopants useful in the invention provide an emitted light having a green hue or a blue-green hue. Substituents are selected to provide embodiments that exhibit a reduced loss of initial luminance compared to the device containing no bis(azinyl)methane boron complex compound.

Compounds useful in the invention are suitably represented by Formula (1):

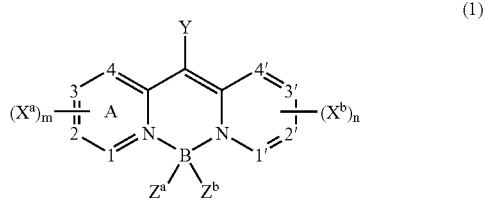

(1)

wherein
A and A' represent independent azine ring systems corresponding to 6-membered aromatic ring systems containing at least one nitrogen;
each $X^a$ and $X^b$ is an independently selected substituent, two of which may join to form a fused ring to A or A' and which may include further fused ring substitution;
m and n are independently 0 to 4;
Y is H or a substituent;
$Z^a$ and $Z^b$ are independently selected substituents;
1, 2, 3, 4, 1', 2', 3', and 4' are independently selected as either carbon or nitrogen atoms;

provided that the selection of each $X^a$ and $X^b$, including further substitution, results in a fused ring system of at least 5 fused rings; and
provided further that there is at least one substituent on the fused ring system sufficient to provide a wavelength of maximum emission of less than 520 nm at a concentration of $<10^{-3}$M in an aprotic solvent.

In the device, 1, 2, 3, 4, 1', 2', 3', and 4' are conveniently all carbon atoms. The device may desirably contain at least one or both of ring A or A' that contains substituents joined to form a fused ring. In one useful embodiment, there is present at least one $X^a$ or $X^b$ group selected from the group consisting of halide and alkyl, aryl, alkoxy, and aryloxy groups. In another embodiment, there is present a $Z^a$ and $Z^b$ group are independently selected from the group consisting of fluorine and alkyl, aryl, alkoxy, alkylthio, arylthio, sulfamoyl (—NRSO$_2$R'), acetamido (—NRCOR'), diarylamino, and aryloxy groups. A desirable embodiment is where $Z^a$ and $Z^b$ are F. Y is suitably hydrogen or a substituent such as a cyano, trifluoromethyl, fluoro, alkylsulfonyl, nitro, or sulfonamido (—SO$_2$NRR') group.

The emission wavelength of these compounds may be adjusted to some extent by appropriate substitution around the central bis(azinyl)methene boron group to meet a color aim, namely green that has a wavelength of maximum emission of less than 520 nm, conveniently less than 515 nm, and desirably less than 510 nm at a concentration of $<10^{-3}$M, and conveniently $<10^{-5}$M in an aprotic solvent such as ethyl acetate, toluene, hexanes, tetrahydrofuran, or dichloromethane.

One useful embodiment of a bis(azinyl)methane boron complex compound of Formula (1) is represented by Formula (2):

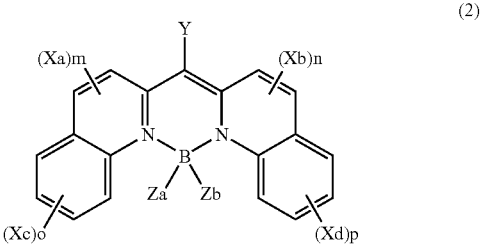

(2)

wherein
each Xa, Xb, Xc, and Xd is an independently selected substituent, two of which may join to form a fused ring and which may include further fused ring substitution;
m and n are independently 0 to 2;
o and p are independently 0 to 4;
Y is H or a substituent;
Za and Zb are independently selected substituents; and
provided further that there is at least one substituent on the fused ring system sufficient to provide a wavelength of maximum emission of less than 520 nm at a concentration of $<10^{-3}$M in an aprotic solvent.

Another useful embodiment of a bis(azinyl)methane boron complex compound of Formula (1) is represented by Formula (3):

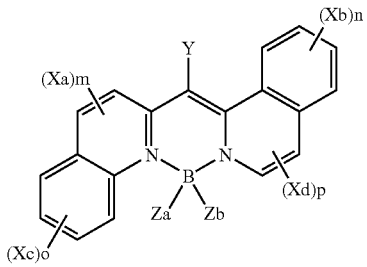

(3)

wherein
- each Xa, Xb, Xc, and Xd is an independently selected substituent, two of which may join to form a fused ring and which may include further fused ring substitution;
- m and p are independently 0 to 2;
- n and o are independently 0 to 4;
- Y is H or a substituent;
- Za and Zb are independently selected substituents; and
- provided further that there is at least one substituent on the fused ring system sufficient to provide a wavelength of maximum emission of less than 520 nm at a concentration of $10^{-3}$M in an aprotic solvent.

The bis(azinyl)methene boron complex compound is usually doped into a host compound, which represents the light-emitting layer between the hole-transporting and electron-transporting layers. The host is chosen such that there is efficient energy transfer from the host to the bis(azinyl) methene boron compound. The bis(azinyl)methene boron complex emits from the excited state to afford a bright, highly-efficient, stable EL device.

The EL device of the invention is useful in any device where light emission is desired such as a lamp or a component in a static or motion imaging device, such as a television, cell phone, DVD player, or computer monitor.

Illustrative examples of bis(azinyl)methene boron complex compounds useful in the present invention are the following:

Inv-1

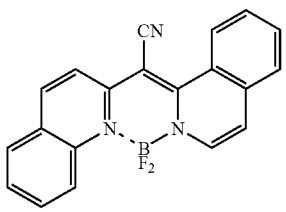

Inv-2

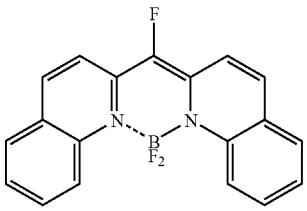

Inv-3

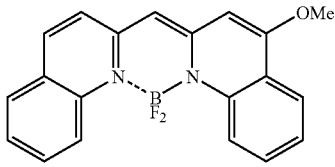

Inv-4

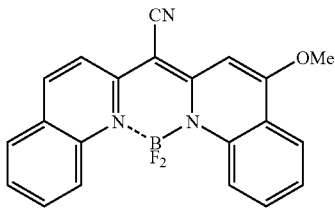

Inv-5

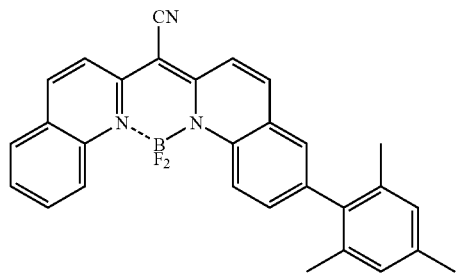

Inv-6

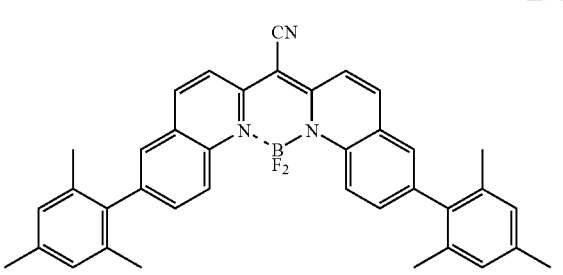

Inv-7

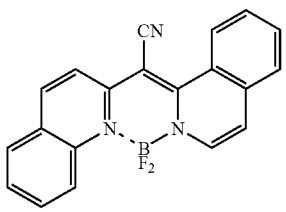

Inv-8

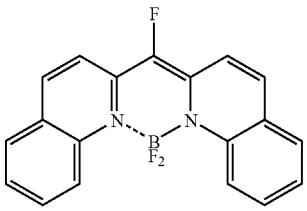

Inv-9

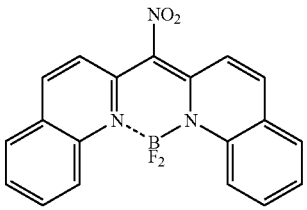

-continued
Inv-10
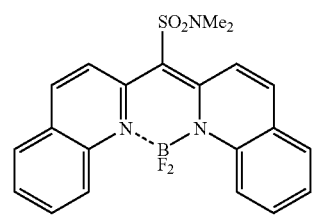
Inv-11
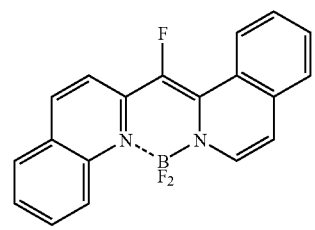
Inv-12
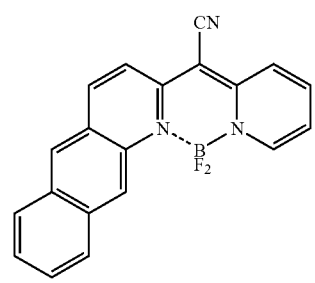
Inv-13
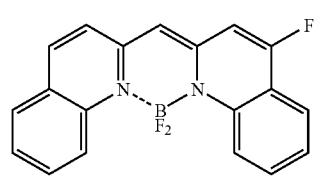
Inv-14
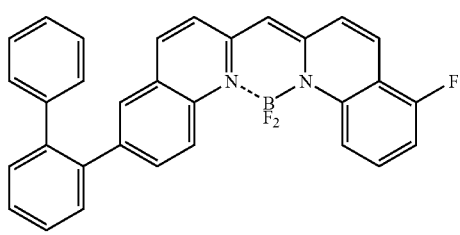
Inv-15
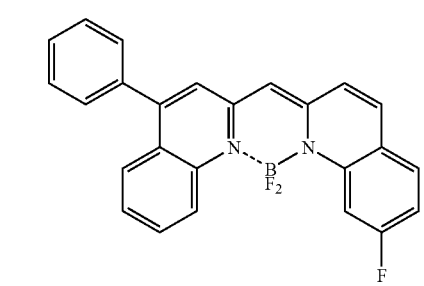
Inv-16
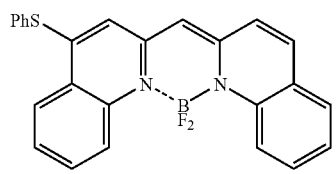
-continued
Inv-17
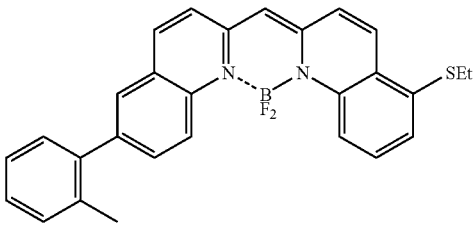
Inv-18
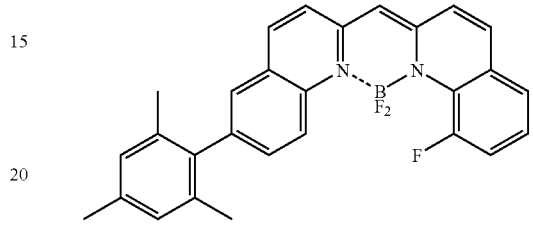
Inv-19
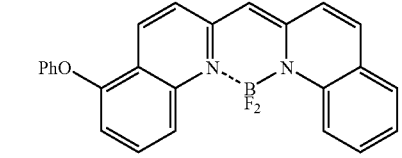
Inv-20
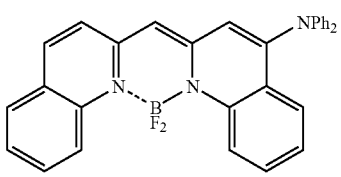
Inv-21
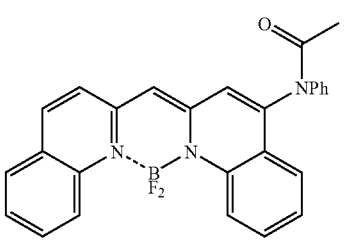
Inv-22
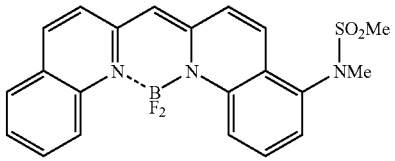
Inv-23
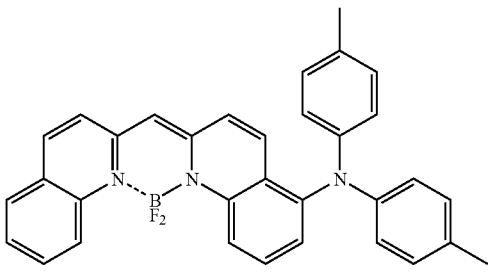

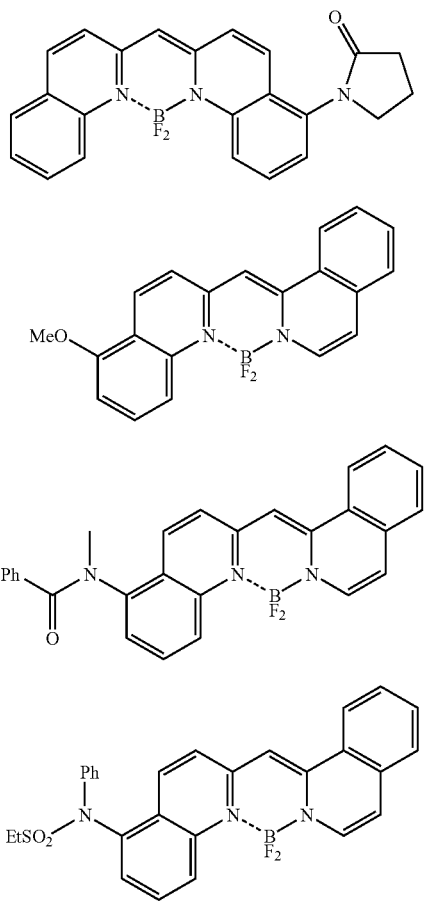

Inv-24

Inv-25

Inv-26

Inv-27

Embodiments of the invention provide not only improved luminance efficiency but a desirable green hue as evidenced by an emission curve having a maximum less than 520 nm as measured in a solution in EtOAc at a dilution less than $10^{-3}$M. Embodiments of the invention also provide improved operational stability as measured by emission loss when operated at 70° C.

Unless otherwise specifically stated, use of the term "substituted" or "substituent" means any group or atom other than hydrogen (what about deuterium). Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy) acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron. such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain the desired desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

General Device Architecture

The present invention can be employed in most OLED device configurations and light emitting devices including the OLED devices described herein. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT).

There are numerous configurations of the organic layers wherein the present invention can be successfully practiced. Essential requirements are a cathode, an anode, an HTL and an LEL. A more typical structure of an OLED device useful in this invention is shown in the figure and contains a substrate 101, an anode 103, an optional hole-injecting layer 105, a hole-transporting layer 107, a light-emitting layer 109, an electron-transporting layer 111, and a cathode 113. The OLED device described herein can be subjected to an applied voltage via anode 103 and cathode 113 so that light-emitting layer 109 emits light. These layers are described in detail below. Note that the substrate may alternatively be located adjacent to the cathode, or the substrate may actually constitute the anode or cathode. Also, the total combined thickness of the organic layers is preferably less than 500 nm.

Substrate

The substrate 101 can either be light transmissive or opaque, depending on the intended direction of light emission. The light transmissive property is desirable for viewing the EL emission through the substrate. Transparent glass or organic material are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials. Of course it is necessary to provide in these device configurations a light-transparent top electrode.

Anode

The conductive anode layer 103 is commonly formed over the substrate and, when EL emission is viewed through the anode, should be transparent or substantially transparent to the emission of interest. Common transparent anode materials used in this invention are indium-tin oxide (ITO) and tin oxide, but other metal oxides can work including, but not limited to, aluminum- or indium-doped zinc oxide (IZO), magnesium-indium oxide, and nickel-tungsten oxide. In addition to these oxides, metal nitrides, such as gallium nitride, and metal selenides, such as zinc selenide, and metal sulfides, such as zinc sulfide, can be used in layer 103. For applications where EL emission is viewed through the top electrode, the transmissive characteristics of layer 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

Hole-Injecting Layer (HIL)

While not always necessary, it is often useful that a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds such as those described in U.S. Pat. No. 4,720,432, and plasma-deposited fluorocarbon polymers such as those described in U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer 107 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine group. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. No. 3,567,450 and U.S. Pat. No. 3,658,520.

A more preferred class of aromatic tertiary amines are those which include at least two aromatic tertiary amine moieties as described in U.S. Pat. No. 4,720,432 and U.S. Pat. No. 5,061,569. Such compounds include those represented by structural formula (A).

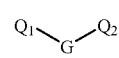

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring group, e.g., a naphthalene. When G is an aryl group, it is conveniently a phenylene, biphenylene, or naphthalene group.

A useful class of triarylamine groups satisfying structural formula (A) and containing two triarylamine groups is represented by structural formula (B):

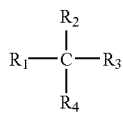

where
R₁ and R₂ each independently represents a hydrogen atom, an aryl group, or an alkyl group or R₁ and R₂ together represent the atoms completing a cycloalkyl group; and
R₃ and R₄ each independently represents an aryl group, which is in turn substituted with a diaryl substituted amino group, as indicated by structural formula (C):

wherein $R_5$ and $R_6$ are independently selected aryl groups. In one embodiment, at least one of $R_5$ or $R_6$ contains a polycyclic fused ring group, e.g., a naphthalene.

Another class of aromatic tertiary amine groups are the tetraaryldiamines. Desirable tetraaryldiamines groups include two diarylamino groups, such as indicated by formula (C), linked through an arylene group. Useful tetraaryldiamines include those represented by formula (D).

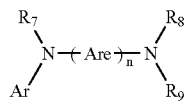

wherein
each Are is an independently selected arylene group, such as a phenylene or anthracene group,
n is an integer of from 1 to 4, and
Ar, $R_7$, $R_8$, and $R_9$ are independently selected aryl groups.

In a typical embodiment, at least one of Ar, $R_7$, $R_8$, and $R_9$ is a polycyclic fused ring group, e.g., a naphthalene.

The various alkyl, alkylene, aryl, and arylene groups of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene groups typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene groups are usually phenyl and phenylene moieties.

The hole-transporting layer can be formed of a single or a mixture of aromatic tertiary amine compounds. Specifically, one may employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:
1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4''-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4''-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4''-diamino-p-terphenyl
4,4'-Bis {N-phenyl-N-[4-(1-naphthyl)-phenyl] amino}biphenyl
4,4'-Bis[N-phenyl-N-(2-pyrenyl)amino]biphenyl
2,6-Bis[N,N-di(2-naphthyl)amine]fluorine
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 109 of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. No. 4,768,292, U.S. Pat. No. 5,141,671, U.S. Pat. No. 5,150,006, U.S. Pat. No. 5,151,629, U.S. Pat. No. 5,405,709, U.S. Pat. No. 5,484,922, U.S. Pat. No. 5,593,788, U.S. Pat. No. 5,645,948, U.S. Pat. No. 5,683,823, U.S. Pat. No. 5,755,999, U.S. Pat. No. 5,928,802, U.S. Pat. No. 5,935,720, U.S. Pat. No. 5,935,721, and U.S. Pat. No. 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

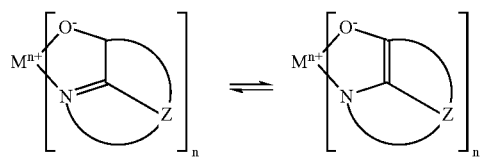

E wherein
M represents a metal;
n is an integer of from 1 to 4; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo {f}-8-quinolinolato]zinc (II)
CO-4: Bis(2-methyl-8-quinolinolato)aluminum(III)-μ-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)]
CO-10: Bis(2-methyl-8-quinolinato)-4-phenylphenolatoaluminum (III)

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange or red.

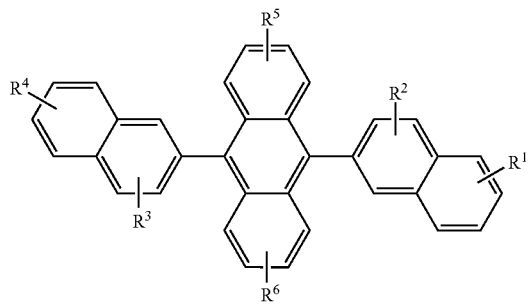

F wherein: $R^1$, $R^2$, $R^3$, $R^4$, $R^5$, and $R^6$ represent hydrogen or one or more substituents selected from the following groups:
  Group 1: hydrogen, alkyl and alkoxy groups typically having from 1 to 24 carbon atoms;
  Group 2: a ring group, typically having from 6 to 20 carbon atoms;
  Group 3: the atoms necessary to complete a carbocyclic fused ring group such as naphthyl, anthracenyl, pyrenyl, and perylenyl groups, typically having from 6 to 30 carbon atoms;
  Group 4: the atoms necessary to complete a heterocyclic fused ring group such as furyl, thienyl, pyridyl, and quinolinyl groups, typically having from 5 to 24 carbon atoms;
  Group 5: an alkoxylamino, alkylamino, and arylamino group typically having from 1 to 24 carbon atoms; and
  Group 6: fluorine, chlorine, bromine and cyano radicals.

Illustrative examples include 9,10-di-(2-naphthyl)anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene, and phenylanthracene derivatives as described in EP 681,019.

Benzazole derivatives (Formula G) constitute another class of useful hosts capable of supporting electroluminescence, and are particularly suitable for light emission of wavelengths longer than 400 nm, e.g., blue, green, yellow, orange or red.

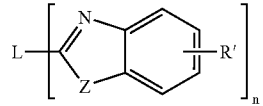

G where:
n is an integer of 3 to 8;
Z is —O, —NR or —S where R is H or a substituent; and R' represents one or more optional substituents where R and each R' are H or alkyl groups such as propyl, t-butyl, and heptyl groups typically having from 1 to 24 carbon atoms; carbocyclic or heterocyclic ring groups such as phenyl and naphthyl, furyl, thienyl, pyridyl, and quinolinyl groups and atoms necessary to complete a fused aromatic ring group typically having from 5 to 20 carbon atoms; and halo such as chloro, and fluoro;

L is a linkage unit usually comprising an alkyl or aryl group which conjugately or unconjugately connects the multiple benzazoles together.

An example of a useful benzazole is 2,2', 2"-(1,3,5-phenylene)tris[1-phenyl-1H-benzimidazole].

Distyrylarylene derivatives as described in U.S. Pat. No. 5,121,029 are also useful host materials in the LEL.

Desirable fluorescent dopants include groups derived from fused ring, heterocyclic and other compounds such as anthracene, tetracene, xanthene, perylene, rubrene, coumarin, rhodamine, quinacridone, dicyanomethylenepyran, thiopyran, polymethine, pyrilium thiapyrilium, and carbostyryl compounds. Illustrative examples of useful dopants include, but are not limited to, the following:

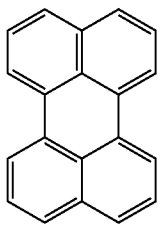

L1

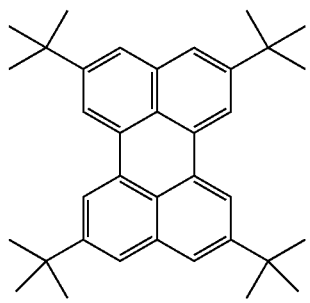

L2

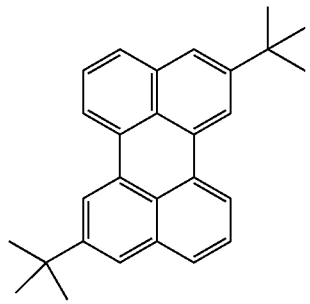

L3

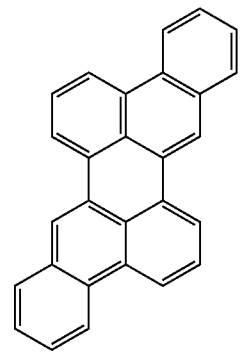

L4

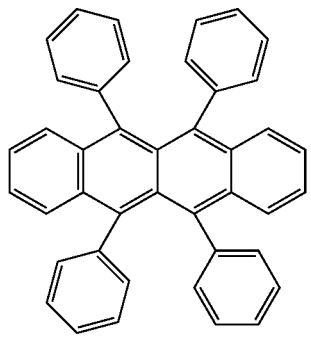

L5

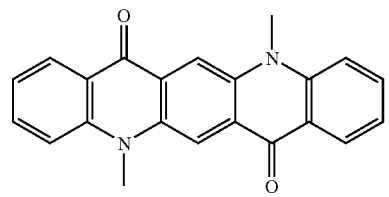

L6

-continued
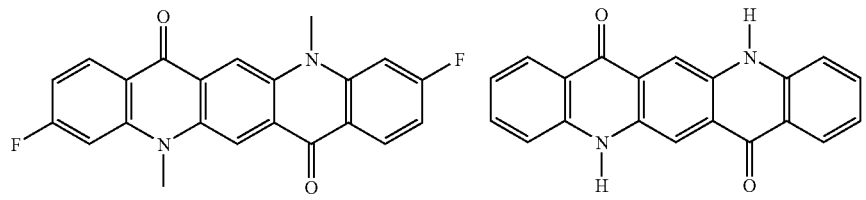
L7  L8
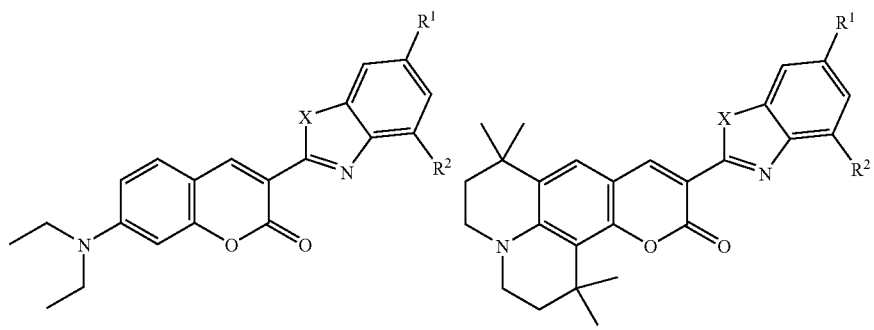
|  | X | R1 | R2 |
| --- | --- | --- | --- |
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

-continued
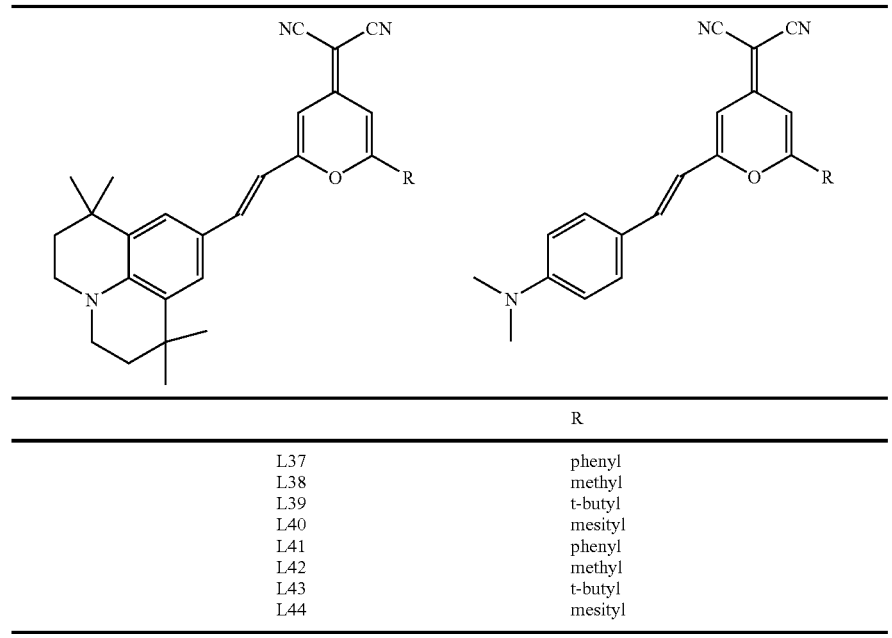
| | R |
|---|---|
| L37 | phenyl |
| L38 | methyl |
| L39 | t-butyl |
| L40 | mesityl |
| L41 | phenyl |
| L42 | methyl |
| L43 | t-butyl |
| L44 | mesityl |
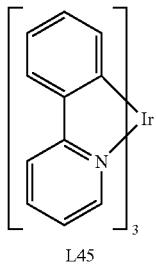
L45
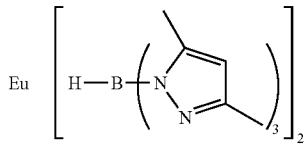
L46
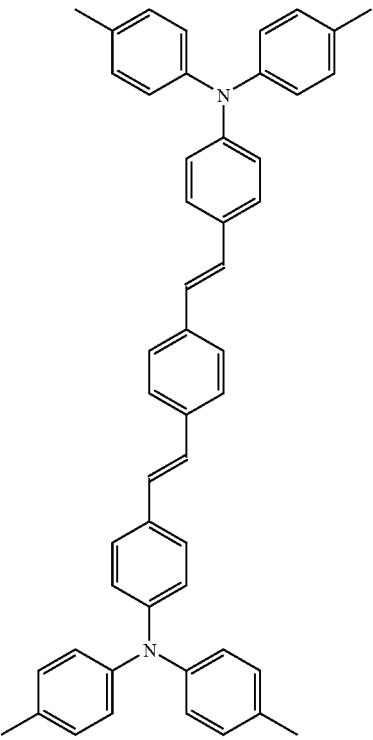
L47
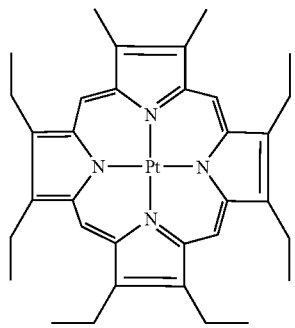
L48

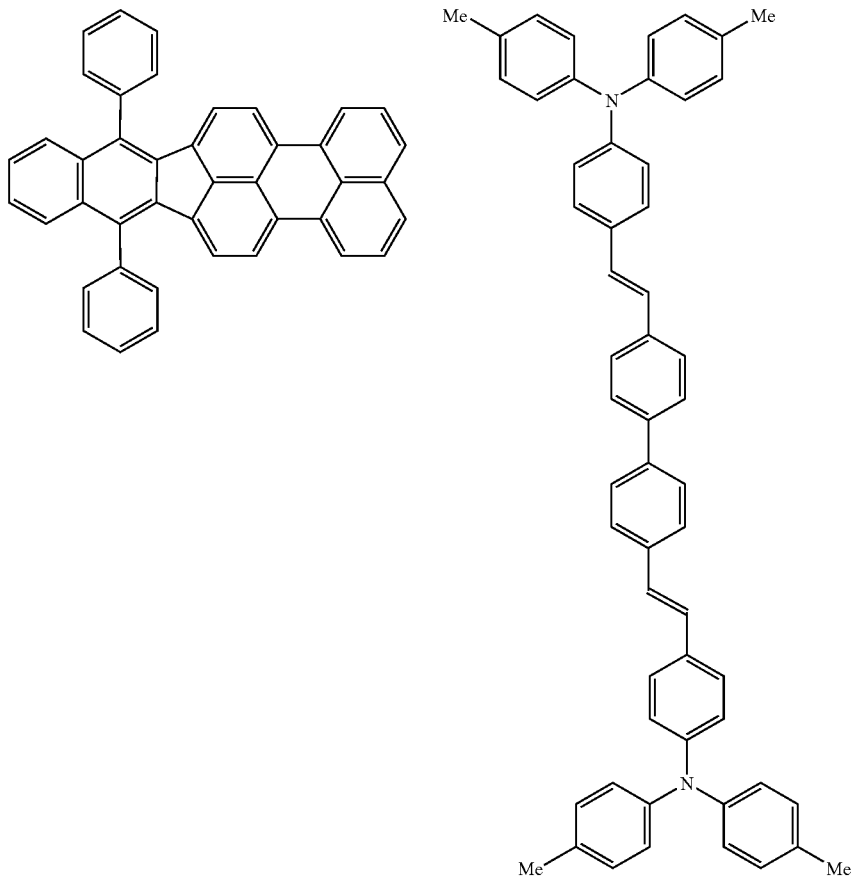

L49        L50

Electron-Transporting Layer (ETL)

Preferred thin film-forming materials for use in forming the electron-transporting layer 111 of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials.

In some instances, layers 109 and 111 can optionally be collapsed into a single layer that serves the function of supporting both light emission and electron transportation.

Cathode

When light emission is through the anode, the cathode layer 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. No. 5,059,861, U.S. Pat. No. 5,059,862, and U.S. Pat. No. 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Deposition of Organic Layers

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,851,709 and U.S. Pat. No. 6,066,357) and inkjet method (U.S. Pat. No. 6,066,357).

Encapsulation

Most OLED devices are sensitive to moisture and/or oxygen so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890.

The invention and its advantages can be better appreciated by the following examples.

EXAMPLES

Maximum Emission and Luminance Efficiency

Emission spectra were obtained for a series of the above inventive examples and the following comparative examples.

| Example | # Rings | Structure |
|---------|---------|-----------|
| Comp-1  | 3       |           |
| Comp-2  | 4       |           |
| Comp-3  | 5       |           |

The emission spectra and quantum yields were obtained at room temperature in ethyl acetate solution at concentrations of $10^{-5}$ to $10^{-6}$ M and expressed as quanta per unit time per unit wavelength interval against wavelength. A fluorescence procedure is well known to those skilled in the art [see, for example, C. A. Parker and W. T. Rees, Analyst, 85, 587 (1960)]. The maximum of emission spectra is defined as the wavelength corresponding to the highest point of such spectrum. The results are shown in the following table.

TABLE 1

| SOLUTION (ETOAC) DATA | | | |
|---|---|---|---|
| Example | Type | E max (soln.) | Quantum Yield. |
| Comp-1 | Comparative | 492 nm | 0.15 |
| Comp-2 | Comparative | 498 nm | 0.63 |
| Comp-3 | Comparative | 520 nm | 0.96 |
| Inv-1 | Inventive | 490 nm | 0.72 |
| Inv-2 | Inventive | 500 nm | 0.67 |
| Inv-3 | Inventive | 506 nm | 0.77 |
| Inv-4 | Inventive | 476 nm | 0.86 |
| Inv-5 | Inventive | 494 nm | 1 |
| Inv-6 | Inventive | 496 nm | 0.74 |

The above table shows that comparative compounds with fewer fused rings (Comp-1 and Comp-2) have desirable emission wavelength, but have lower efficiency as shown by the quantum yield. The use of five fused rings (Comp-3) has a high efficiency, but the emission wavelength of 520 nm is less desirable. However, the compounds with five fused rings and substituent groups in accordance with this invention (Inv-1 to Inv-6) have high efficiencies and a desirable emission wavelength.

Preparation of Bis(2-quinolinyl)acetonitrile:

To a solution of 2-quinolylacetonitrile (14.5 g, 86.2 mmol) in toluene (200 mL) was added slowly NaH (6.9 g of 60% oil dispersion, 172 mmol). The reaction mixture was stirred at ambient temperature for 15 min at which point $H_2$ evolution was no longer evident. A solution of 2-chloroquinoline (14.1 g, 86.2 mmol) in toluene (150 mL) was added to the reaction flask, and the reaction mixture was then heated at reflux for 18 h. The reaction mixture was cooled to ambient temperature, diluted with THF, and quenched with $H_2O$. The organic solution was washed with 1N HCl (200 mL), saturated aqueous solution of $NaHCO_3$, and brine. An orange solid precipitated from the organic layer and was isolated via vacuum filtration. The mother liquor was dried over $MgSO_4$ and the volatile components were removed with a rotary evaporator. The resulting solid was combined with the orange powder isolated via filtration. The solid was washed with a mixture of ether and heptane to afford 14.7 g (57.6%) of product. Results of $^1H$ NMR spectroscopy and electrospray mass spectroscopy are consistent with the product.

Preparation of Difluoro[1,2-dihydro-2[(2-guinolinyl-κN)cyanomethine]guinolinato-κN]boron (Inv-1)

A mixture of bis(2-quinolinyl)acetonitrile, diisopropylethylamine, $BF_3$-etherate, and acetonitrile were placed in a sealed pressure bottle and heated in a 120° C. oil bath for 8 h. Once cooled to ambient temperature the solid was collected and washed with cold acetonitrile to provide product in 77% yield. Results of $^1H$ NMR spectroscopic analysis is consistent with the product.

Other materials of the invention were prepared in an analogous fashion.

Example 2

EL Device Fabrication—Inventive Example

An EL device (Sample 1) satisfying the requirements of the invention was constructed in the following manner:
1. A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL) by plasma-assisted deposition of $CHF_3$.
3. A hole-transporting layer (HTL) of N,N'-di-1-naphthyl-N,N'-diphenyl-4,4'-diaminobiphenyl (NPB) having a thickness of 75 nm was then evaporated from a tantalum boat.
4. A 25 nm light-emitting layer (LEL) of 2-tert-butyl-9,10-di-(2-naphthyl)anthracene (TBADN) and Inv-1 (0.7% wt %) were then deposited onto the hole-transporting layer. These materials were also evaporated from tantalum boats.
5. A 35 nm electron-transporting layer (ETL) of tris (8quinolinolato)aluminum (III) ($AlQ_3$) was then deposited onto the light-emitting layer. This material was also evaporated from a tantalum boat.
6. On top of the $AlQ_3$ layer was deposited a 220 nm cathode formed of a 10:1 volume ratio of Mg and Ag.

The above sequence completed the deposition of the EL device. The device was then hermetically packaged in a dry glove box for protection against ambient environment.

Samples 2, 3, 4, and 5 were EL devices incorporating Inv-2, Inv-5, Inv-6 or Comp-3 fabricated in an identical manner as the example incorporating Inv-1 but at levels indicated in the table. The cells thus formed were tested for efficiency (in the form of luminance yield), and the results are listed in Table 2.

The stability of the devices was tested by operating the devices at 20 $mA/cm^2$ in an oven at 70° C. The stability, as a percent loss of normalized luminance after 220 h, is reported in the table.

Example 3

EL Device Fabrication—Inventive Example

An EL device (Sample 6) satisfying the requirements of the invention was constructed in the following manner:
1. A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) HIL by plasma-assisted deposition of $CHF_3$.
3. A HTL of N,N'-di-1-naphthalenyl-N,N'-diphenyl-4,4'-diaminobiphenyl (NPB) having a thickness of 75 nm was then evaporated from a tantalum boat.
4. A 37.5 nm LEL of tris(8quinolinolato)aluminum (III) ($AlQ_3$) and Inv-1 (0.7 wt %) were then deposited onto the hole-transporting layer. These materials were also evaporated from tantalum boats.
5. A 37.5 nm ETL of tris(8quinolinolato)aluminum (III) ($AlQ_3$) was then deposited onto the light-emitting layer. This material was also evaporated from a tantalum boat.
6. On top of the $AlQ_3$ layer was deposited a 220 nm cathode formed of a 10:1 volume ratio of Mg and Ag.

The above sequence completed the deposition of the EL device. The device was then hermetically packaged in a dry glove box for protection against ambient environment.

TABLE 2

EVALUATION RESULTS FOR EL DEVICES.

| Sample | Host | Dopant | Level (%) | Efficiency (cd/A)[1] | Emission Max.[1] | % loss after 202 h @ 70° C., 20 mA/cm² | Type |
|---|---|---|---|---|---|---|---|
| 1 | TBADN | Inv-1 | 0.7 | 6.36 | 504 nm | 23.5% | Invention |
| 2 | TBADN | Inv-2 | 0.4 | 5.74 | 512 nm | 14.7% | Invention |
| 3 | TBADN | Inv-5 | 0.7 | 6.08 | 508 nm | 21.3% | Invention |
| 4 | TBADN | Inv-6 | 0.4 | 6.53 | 504 nm | 23.8% | Invention |
| 5 | TBADN | Comp-3 | 0.5 | 9.10 | 532 nm | 29.3% | Comparison |

[1]Data reported at 20

As can be seen from Table 2, all tested EL devices incorporating the INV dopants demonstrated superior color relative to the comparative device containing Comp-3. These doped EL devices exhibit green electroluminescence with $Emission_{max}$ ranging from 504-512 nm. Also, thestability of the tested embodiments was superior for the invention.

Samples 7, 8, 9, and 10 were EL devices incorporating Inv-2, Inv-5, Inv-6 or Comp-3 fabricated in an identical manner as the example incorporating Inv-1 but at levels indicated in the table. The cells thus formed were tested for efficiency (in the form of luminance yield), and the results are listed in Table 3.

TABLE 3

EVALUATION RESULTS FOR EL DEVICES.

| Sample | Host | Dopant | Level (%) | Efficiency (cd/A)[1] | Emission Max.[1] | % loss after 202 h @ 70° C., 20 mA/cm² | Type |
|---|---|---|---|---|---|---|---|
| 6 | $AlQ_3$ | Inv-1 | 0.7 | 7.03 | 504 nm | 37.8% | Invention |
| 7 | $AlQ_3$ | Inv-2 | 0.7 | 7.17 | 512 nm | 42.9% | Invention |
| 8 | $AlQ_3$ | Inv-5 | 0.4 | 8.41 | 508 nm | 32.2% | Invention |

TABLE 3-continued

EVALUATION RESULTS FOR EL DEVICES.

| Sample | Host | Dopant | Level (%) | Efficiency (cd/A)[1] | Emission Max.[1] | % loss after 202 h @ 70° C., 20 mA/cm² | Type |
|---|---|---|---|---|---|---|---|
| 9 | AlQ₃ | Inv-6 | 0.4 | 6.92 | 512 nm | 25.6% | Invention |
| 10 | AlQ₃ | Comp-3 | 0.7 | 10.39 | 540 nm | 41.5% | Comparison |

[1]Data reported at 20 mA/cm².

As can be seen from Table 3, the tested EL device incorporating the INV dopants in an AlQ₃ host demonstrated superior color relative to the comparative device. The comparative device exhibited a yellow-green emission (emission maximum of 540 nm) as opposed to the more desirable green emission of the invention (504-512 nm).

Example 4

EL Device Fabrication with Mixed Host—Inventive Example

An EL device (Sample 11) satisfying the requirements of the invention was constructed in the following manner:
1. A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) HIL by plasma-assisted deposition of CHF₃.
3. A HTL of N,N'-di-1-naphthalenyl-N,N'-diphenyl-4,4'-diaminobiphenyl (NPB) having a thickness of 75 nm was then evaporated from a tantalum boat.
4. A 37.5 nm LEL of tris(8quinolinolato)aluminum (III) (AlQ₃) and Inv-2 (0.5 wt %) were then deposited onto the hole-transporting layer. These materials were also evaporated from tantalum boats.
5. A 37.5 nm ETL of tris(8quinolinolato)aluminum (III) (AlQ₃) was then deposited onto the light-emitting layer. This material was also evaporated from a tantalum boat.
6. On top of the AlQ₃ layer was deposited a 220 nm cathode formed of a 10:1 volume ratio of Mg and Ag.

The above sequence completed the deposition of the EL device. The device was then hermetically packaged in a dry glove box for protection against ambient environment.

Samples 12, 13, and 14 were EL devices fabricated in an identical manner as the example, but incorporating an additional co-host material, tBADN, in the emissive layer. This was effected by co-evaporating the tBADN from another tantalum boat along with the ALQ and Inv-2. The total thickness of this emissive layer was nominally maintained at 37.5 nm. The approximate percent levels of the tBADN relative to the ALQ are given in Table 4. Samples 15, 16, 17, and 18 were fabricated in an identical manner as the example incorporating Inv-2 but using Inv-5. Samples 19, 20, 21, and 22 were fabricated in an identical manner as the example incorporating Inv-2 but using Inv-6. The cells thus formed were tested for efficiency (in the form of luminance yield) and the results are listed in Table 4. The stability of the devices was tested by operating the devices at 20 mA/cm² in an oven at 70° C. The stability, as a percent loss of normalized luminance after 220 h, is reported in the table.

TABLE 4

EVALUATION RESULTS FOR EL DEVICES WITH MIXED HOSTS.

| Sample | % tBADN in ALQ | Dopant | Dopant Level (%) | Efficiency (cd/A)[1] | Emission Max.[1] | % loss after 220 h @ 70° C., 20 mA/cm² |
|---|---|---|---|---|---|---|
| 11 | 0% | Inv-2 | 0.5 | 6.71 | 516 nm | 35.5% |
| 12 | 50% | Inv-2 | 0.5 | 5.95 | 512 nm | 25.8% |
| 13 | 75% | Inv-2 | 0.5 | 6.16 | 512 nm | 23.5% |
| 14 | 100% | Inv-2 | 0.5 | 6.52 | 512 nm | 28.8% |
| 15 | 0% | Inv-5 | 0.5 | 8.06 | 508 nm | 35.5% |
| 16 | 50% | Inv-5 | 0.5 | 6.55 | 508 nm | 16.9% |
| 17 | 75% | Inv-5 | 0.5 | 8.69 | 508 nm | 16.9% |
| 18 | 100% | Inv-5 | 0.5 | 6.36 | 508 nm | 12.0% |
| 19 | 0% | Inv-6 | 0.5 | 6.68 | 512 nm | 29.1% |
| 20 | 50% | Inv-6 | 0.5 | 6.31 | 508 nm | 17.2% |
| 21 | 75% | Inv-6 | 0.5 | 6.98 | 508 nm | 14.2% |
| 22 | 100% | Inv-6 | 0.5 | 6.10 | 508 nm | 10.9% |

[1]Data reported at 20 mA/cm².

As can be seen from Table 4, the tested EL device incorporating the mixed emissive layer (TBADN and AlQ₃) host demonstrated superior stability relative to ALQ host alone. Also the preferred level of host for best stability and luminance can be observed to be greater than 50% TBADN, but less than 100% TBADN.

The entire contents of the patents and other publications referred to in this specification are incorporated herein by reference. The invention has been described in detail with particular reference to certain preferred embodiments thereof, but it will be understood that variations and modifications can be effected within the spirit and scope of the invention.

PARTS LIST

101 Substrate
103 Anode
105 Hole-Injecting layer (HIL)
107 Hole-Transporting layer (HTL)
109 Light-Emitting layer (LEL)
111 Electron-Transporting layer (ETL)
113 Cathode

The invention claimed is:

1. An OLED device comprising a light-emitting layer containing a light emitting bis(azinyl)methene boron complex compound represented by Formula (1):

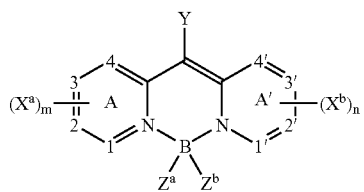

(1)

wherein
- A and A' represent independent azine ring group systems corresponding to 6-membered aromatic ring systems containing at least one nitrogen;
- each $X^a$ and $X^b$ is an independently selected substituent, two of which may join to form a fused ring to A or A' which may include further fused ring substitution;
- m and n are independently 0 to 4;
- Y is H or a substituent:
- $Z^a$ and $Z^b$ are independently selected substituents;
- wherein
  - either (1) at least one of $X^a$ and $X^b$ is selected from the group consisting of fluoro and alkyl, alkoxy, sulfamoyl, amido, amino, and aryloxy groups or (2) Y is selected from the group consisting of cyano, trifluoromethyl, fluoro, alkylsulfonyl, nitro, and sulfonamido groups or (3) both (1) and (2) are satisfied;
- provided that 1, 2, 3, 4, 1', 2', 3', and 4' are independently selected as either carbon or nitrogen atoms;
- and provided that the selection of each $X^a$ and $X^b$, including further substitution, results in a fused ring system of at least 5 fused rings; and
- provided further that there is at least one substituent on the fused ring system sufficient to provide a wavelength of maximum emission of less than 520 nm at a concentration of $<10^{-3}$M in EtOAc.

2. The device of claim 1 wherein the bis(azinyl)methene boron complex compound is a polymer.

3. The device of claim 1 wherein the boron complex compound includes a bis(pyridinyl)methene boron complex group.

4. The device of claim 1 wherein the boron complex compound includes a bis(quinolinyl)methene boron complex group.

5. The device of claim 1 wherein the layer comprises a host and dopant where the dopant is present in an amount of up to 10 wt % of the host.

6. The device of claim 5 wherein the host comprises a chelated oxinoid compound or an anthracene compound.

7. The device of claim 6 wherein the host comprises a chelated oxinoid compound.

8. The device of claim 7 wherein the host comprises tris(8-quinolinolato)aluminum (III).

9. The device of claim 6 wherein the host comprises an anthracene compound.

10. The device of claim 9 wherein the host comprises a 9,10-di-(2-naphthyl)anthracene compound.

11. The device of claim 9 wherein the host comprises a 2-tert-butyl-9,10-di-(2-naphthyl)anthracene compound.

12. The device of claim 5 wherein the dopant is present in an amount of 0.1-5.0 wt % of the host.

13. The device of claim 1 wherein the substituents provide a reduced loss of initial luminance compared to the device containing no bis(azinyl)methane boron complex compound.

14. The device of claim 1 wherein 1, 2, 3, 4, 1', 2', 3', and 4' are all carbon atoms.

15. The device of claim 1 wherein at least one of ring A or A' contains substituents joined to form a fused ring.

16. The device of claim 1 wherein both ring A and A' contain substituents joined to form a fused ring.

17. The device of claim 1 wherein at least one of $Z^a$ and $Z^b$ are independently selected from the group consisting of fluoro and alkyl, aryl, alkoxy and aryloxy groups.

18. The device of claim 17 wherein at least one of $Z^a$ and $Z^b$ is F.

19. The device of claim 1 wherein the wavelength of maximum emission is less than 515 nm.

20. The device of claim 19 wherein the wavelength of maximum emission is less than 510 nm.

21. The device of claim 1 wherein the bis(azinyl)methane boron complex compound comprises a ring system of five or six fused rings.

22. The device of claim 1 wherein the bis(azinyl)methane boron complex compound comprises a ring system of five fused rings.

23. The device of claim 1 wherein Y is cyano.

24. The device of claim 1 wherein Y is trifluoromethyl.

25. The device of claim 1 wherein the boron complex compound is selected from the following:

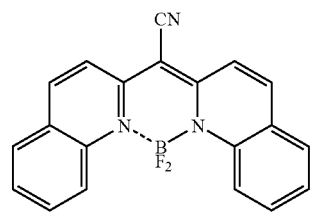

Inv-1

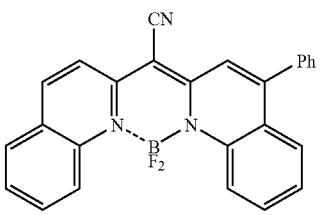

Inv-2

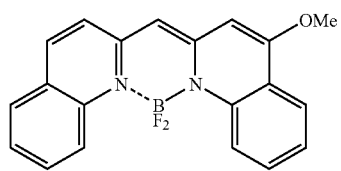

Inv-3

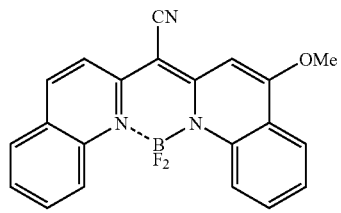

Inv-4

-continued
Inv-5
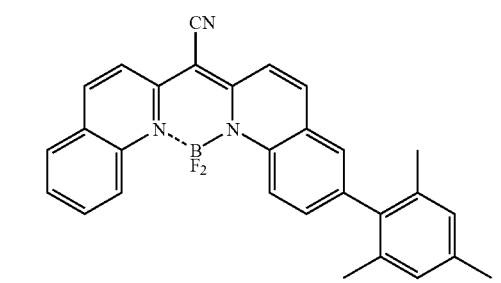
Inv-6
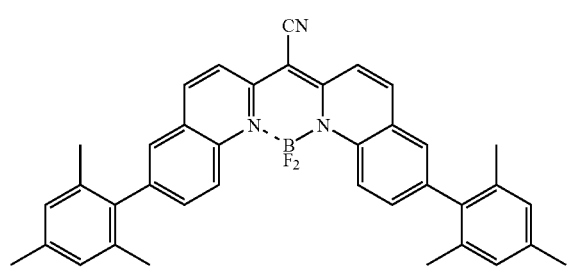
Inv-7
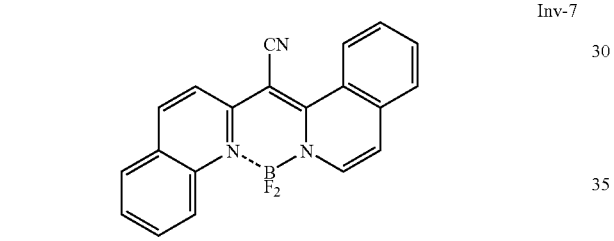
Inv-8
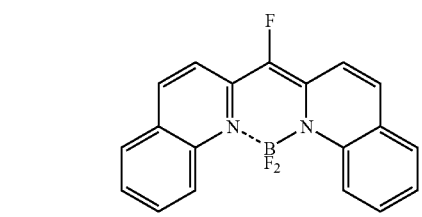
Inv-9
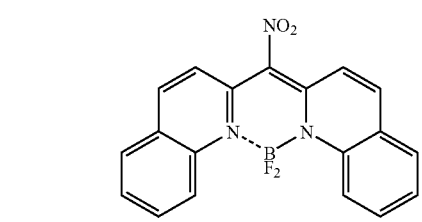
Inv-10
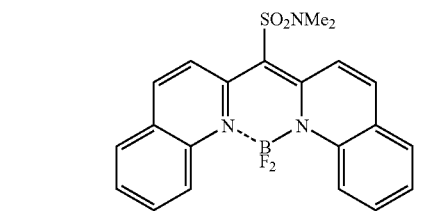
-continued
Inv-11
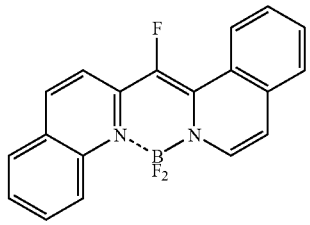
Inv-12
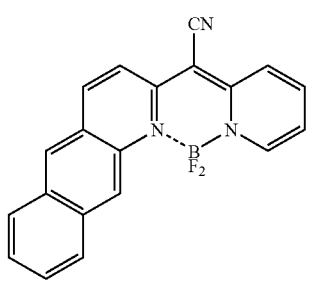
Inv-20
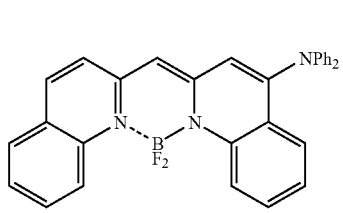
Inv-21
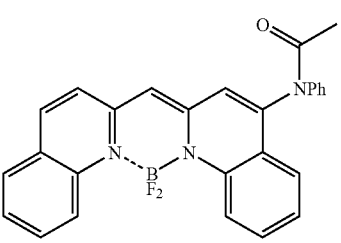
26. The device of claim 1 wherein the boron compound is selected from the following:
Inv-1
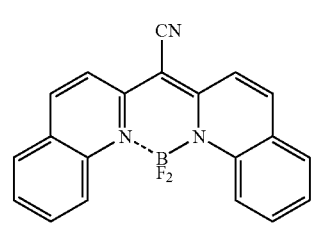
Inv-2
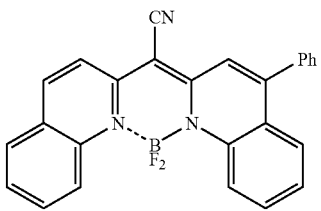

-continued

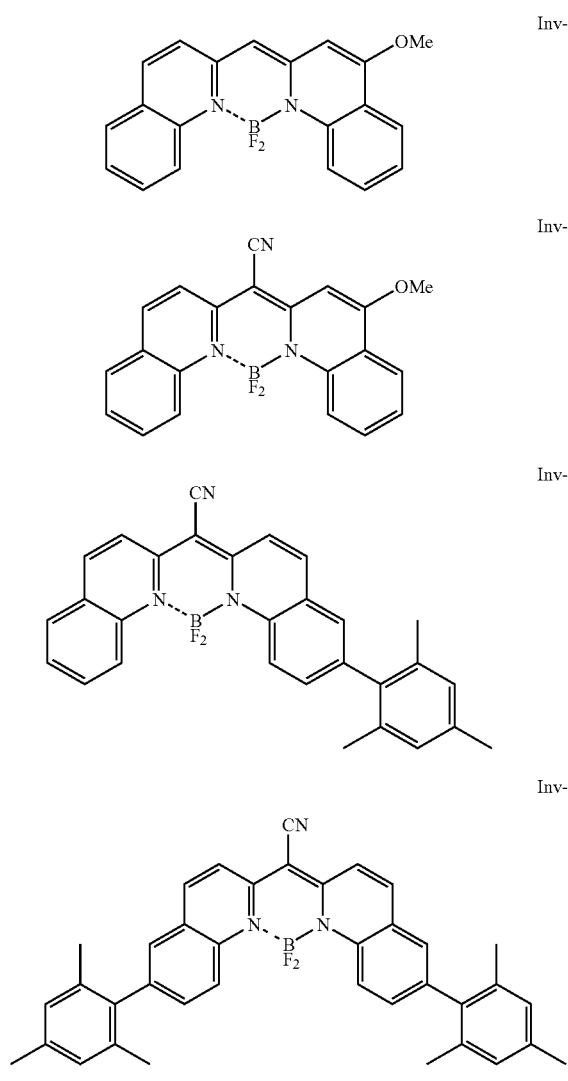

Inv-3

Inv-4

Inv-5

Inv-6

-continued

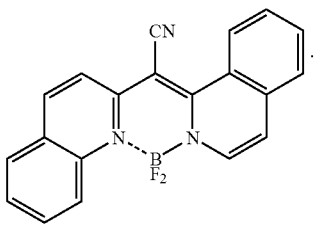

Inv-7

27. A light emitting device containing the OLED device of claim 1.

28. A method of emitting light comprising subjecting the device of claim 1 to an applied voltage.

29. The device of claim 1 wherein the light emitting layer comprises two hosts of at least 5 wt % of the layer of each, one being a chelated oxinoid, and the other an anthracene compound.

30. The device of claim 29 wherein the light emitting layer comprises two hosts of at least 5 wt % of the layer of each, one being represented by the formula:

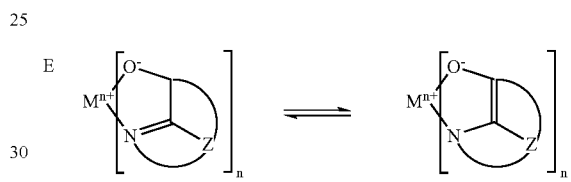

E wherein
  M represents a metal;
  n is an integer of from 1 to 4; and
  Z independently in each occurrence represents the atoms completing a nucleus having at least two fused aromatic rings.

31. The device of claim 29 wherein the anthracene host is a 2-tert-butyl-9, 10-di-(2-naphthyl)anthracene (TBADN).

32. The device of claim 29 wherein the anthracene is present in an amount of greater than 50 wt % of the layer.

33. The device of claim 29 wherein the anthracene is present in an amount of greater than 75 wt % of the layer.

* * * * *